United States Patent
Han (10) Patent No.: US 9,053,940 B2
(45) Date of Patent: Jun. 9, 2015

(54) MASK FOR FORMING SEMICONDUCTOR PATTERN, PATTERNING SYSTEM WITH THE SAME, AND METHOD OF FABRICATING SEMICONDUCTOR DEVICE USING THE SAME

(71) Applicant: Samsung Display Co., Ltd., Yongin, Gyeonggi-Do (KR)

(72) Inventor: Jiwon Han, Hwaseong-si (KR)

(73) Assignee: Samsung Display Co., Ltd. (KR)

( * ) Notice: Subject to any disclaimer, the term of this patent is extended or adjusted under 35 U.S.C. 154(b) by 1 day.

(21) Appl. No.: 14/097,916

(22) Filed: Dec. 5, 2013

(65) Prior Publication Data

US 2015/0011078 A1 Jan. 8, 2015

(30) Foreign Application Priority Data

Jul. 4, 2013 (KR) .......................... 10-2013-0078455

(51) Int. Cl.
*H01L 21/00* (2006.01)
*H01L 21/02* (2006.01)
(52) U.S. Cl.
CPC .... *H01L 21/02639* (2013.01); *H01L 21/02623* (2013.01)
(58) Field of Classification Search
CPC .................... H01L 21/02653; H01L 21/02642
USPC .................. 438/500; 118/301, 315; 427/427.1
See application file for complete search history.

(56) References Cited

U.S. PATENT DOCUMENTS

| 5,074,244 | A | * | 12/1991 | Byers ............................. 118/669 |
| 5,097,792 | A | * | 3/1992 | Umemura et al. ............ 118/314 |
| 5,720,820 | A | * | 2/1998 | Boger et al. ................... 118/669 |
| 8,888,244 | B2 | * | 11/2014 | Kang et al. ...................... 347/47 |
| 2002/0081118 | A1 | * | 6/2002 | Sakurai et al. ................ 396/564 |
| 2007/0153075 | A1 | | 7/2007 | Lee |
| 2007/0231458 | A1 | * | 10/2007 | Gale et al. .................... 427/2.11 |
| 2011/0097494 | A1 | * | 4/2011 | Kerr et al. .................. 427/255.5 |

FOREIGN PATENT DOCUMENTS

| KR | 1020070073394 A | 7/2007 |
| KR | 1020080023474 A | 3/2008 |
| KR | 1020090025401 A | 3/2009 |

* cited by examiner

*Primary Examiner* — Caridad Everhart
(74) *Attorney, Agent, or Firm* — Innovation Counsel LLP (57) ABSTRACT

A mask for forming a semiconductor pattern includes a first body portion provided with a first through hole for injecting a semiconductor material and a second body portion provided with a second through hole for exhausting a gas. As the result of the gas suction through the second through hole, the semiconductor material may be crystallized to form a semiconductor pattern on a base substrate. A thickness of the semiconductor pattern can be controlled by a space between the mask and the base substrate, and a crystal structure of the semiconductor pattern can be controlled by an amount of the gas to be exhausted through the second through hole.

17 Claims, 12 Drawing Sheets

MASK FOR FORMING SEMICONDUCTOR PATTERN, PATTERNING SYSTEM WITH THE SAME, AND METHOD OF FABRICATING SEMICONDUCTOR DEVICE USING THE SAME

CROSS-REFERENCE TO RELATED APPLICATIONS

This U.S. non-provisional patent application claims priority under 35 U.S.C. §119 to Korean Patent Application No. 10-2013-0078455, filed on Jul. 4, 2013, in the Korean Intellectual Property Office, the entire contents of which are hereby incorporated by reference.

BACKGROUND

The inventive concept relates to a mask for forming a semiconductor pattern, a patterning system with the same, and a method of fabricating a semiconductor device using the same.

A display panel includes a plurality of pixels. Depending upon the type of the display panel, each of the pixels is configured to include either a light shutter or a light-emitting device. At least one thin-film transistor used to control the switching of the light shutter or the light-emitting device is included in each pixel. The thin-film transistor includes a control electrode, a semiconductor pattern, an input electrode, and an output electrode.

The semiconductor pattern is used as a channel region of the thin-film transistor. Various methods have been used to form the semiconductor pattern on the display panel. According to a conventional method of forming the semiconductor pattern using a liquid semiconductor material, the liquid semiconductor material may be spotted on the display panel, and then, the spotted semiconductor material may be dried and crystallized. However, the semiconductor pattern formed by this method suffers from non-uniformity in the thickness of the semiconductor layer and non-uniformity of the semiconductor crystal structure.

SUMMARY

A mask allowing a semiconductor pattern to have a significant improvement of uniformity in thickness and crystal structure, a patterning system with the mask, and a method of fabricating a semiconductor device using the mask are provided.

A mask for forming a semiconductor pattern includes a first body portion including a first lower surface, a first upper surface, and a first through hole configured to allow a liquid semiconductor material to flow from above the first upper surface toward the first lower surface, and a second body portion including a second lower surface, a second upper surface, and a second through hole configured to allow a gas to be exhausted from below the second lower surface to above the second upper surface. The second lower surface may be positioned closer to the first upper surface as compared with the first lower surface, thereby forming a staircase structure.

The mask may further include a supplying conduit supplying the liquid semiconductor material to the first through hole. The supplying conduit may include a portion inserted into the first through hole. The mask may further include an exhausting conduit guiding the gas to be exhausted through the second through hole. The exhausting conduit may include a portion inserted into the second through hole.

The second through hole may penetrate the second body portion at an angle that is not perpendicular to the second lower surface. In a plan view, the first through hole and the second through hole may be disposed spaced apart from each other along a first direction, and the second through hole has a shape extending along a second direction crossing the first direction.

The first body portion may have a thickness greater than that of the second body portion, when measured along a direction normal to a plane defined by the first and second directions. The first body portion and the second body portion may have the same width, when measured along the second direction. The first body portion and the second body portion may be provided to form a single body.

The mask may further include a bending portion connecting the first body portion to the second body portion along the first direction.

A system for forming a semiconductor pattern may include a mask including a first body portion and a second body portion, the first body portion including a first lower surface, a first upper surface, and a first through hole configured to allow a liquid semiconductor material to be injected from above the first upper surface toward the first lower surface, the second body portion including a second lower surface, a second upper surface, and a second through hole configured to allow a gas to be exhausted from below the second lower surface to above the second upper surface, the second lower surface being positioned closer to the first upper surface as compared with the first lower surface, thereby forming a staircase structure, a supplying part supplying the liquid semiconductor material to the first through hole, an gas suction part sucking the gas through the second through hole, and a driving part controlling a position of the mask.

A method of fabricating a semiconductor device may include forming a semiconductor pattern on a surface of a base substrate using a mask, the mask including a first body portion and a second body portion, the first body portion including a first lower surface, a first upper surface, and a first through hole configured to allow a liquid semiconductor material to be injected from above the first upper surface toward the first lower surface, the second body portion including a second lower surface, a second upper surface, and a second through hole configured to allow a gas to be exhausted from below the second lower surface to above the second upper surface, the second lower surface being positioned closer to the first upper surface as compared with the first lower surface, thereby forming a staircase structure; forming a control electrode to be partially overlapped with the semiconductor pattern, forming an input electrode to be connected to a portion of the semiconductor pattern, and forming an output electrode to be connected to an other portion of the semiconductor pattern and be disposed spaced apart from the input electrode.

The forming of the semiconductor pattern may include positioning the mask at a reference position, thereby disposing the first lower surface of the first body portion to face and be spaced apart from the base substrate, supplying the liquid semiconductor material to the base substrate through the first through hole, moving the mask to increase an area of the liquid semiconductor material supplied on the base substrate, and sucking the gas through the second through.

BRIEF DESCRIPTION OF THE DRAWINGS

Example embodiments will be more clearly understood from the following description taken in conjunction with the accompanying drawings. The accompanying drawings represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the example embodiments set forth herein; rather, these example embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element, or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below, depending upon the actual orientation of the device. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof Unless otherwise defined, all terms (including technical and scientific terms) used herein have the same meaning as commonly understood by one of ordinary skill in the relevant art. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 1:
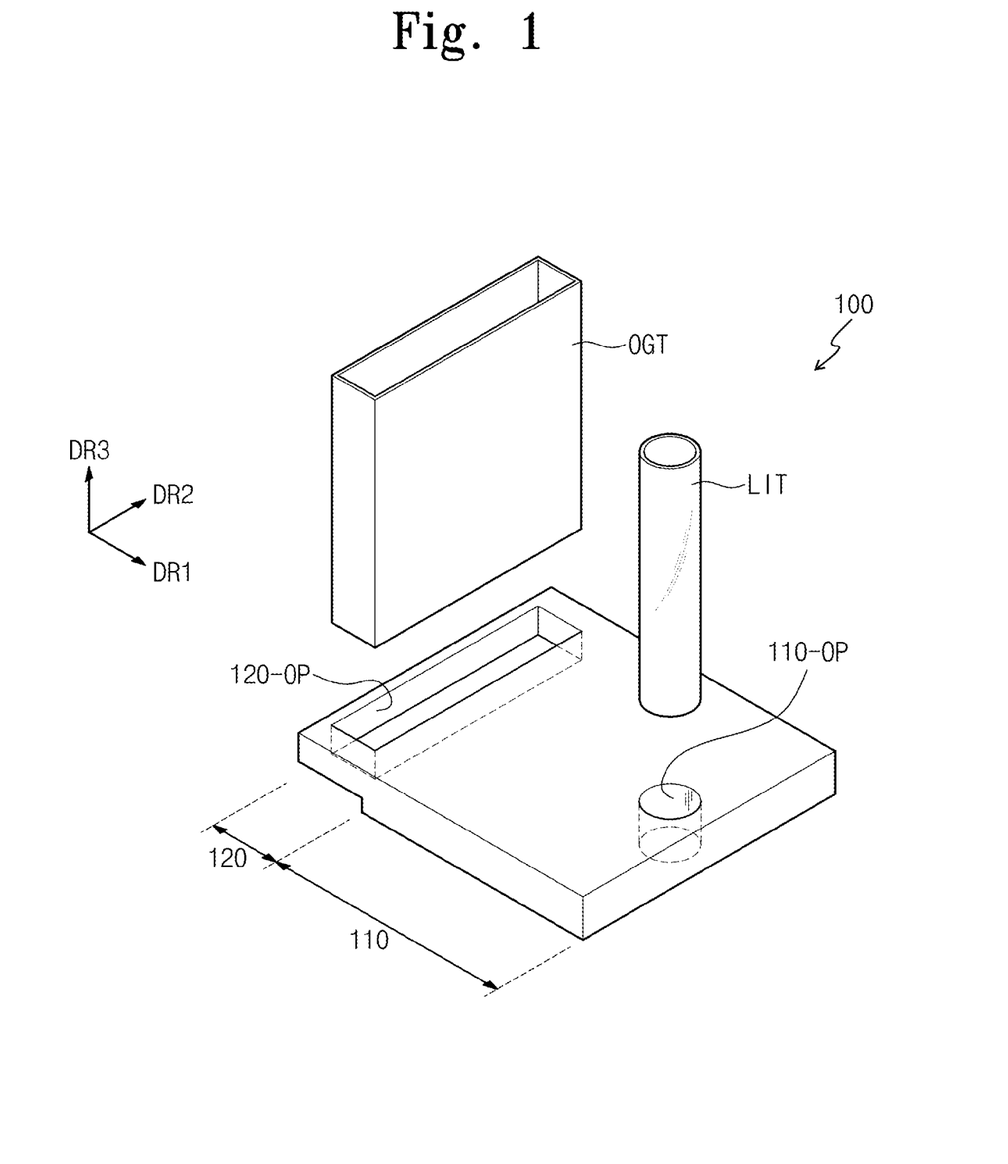
FIG. 1 is an exploded perspective view of a mask according to example embodiments of the inventive concept.
Figure 2:
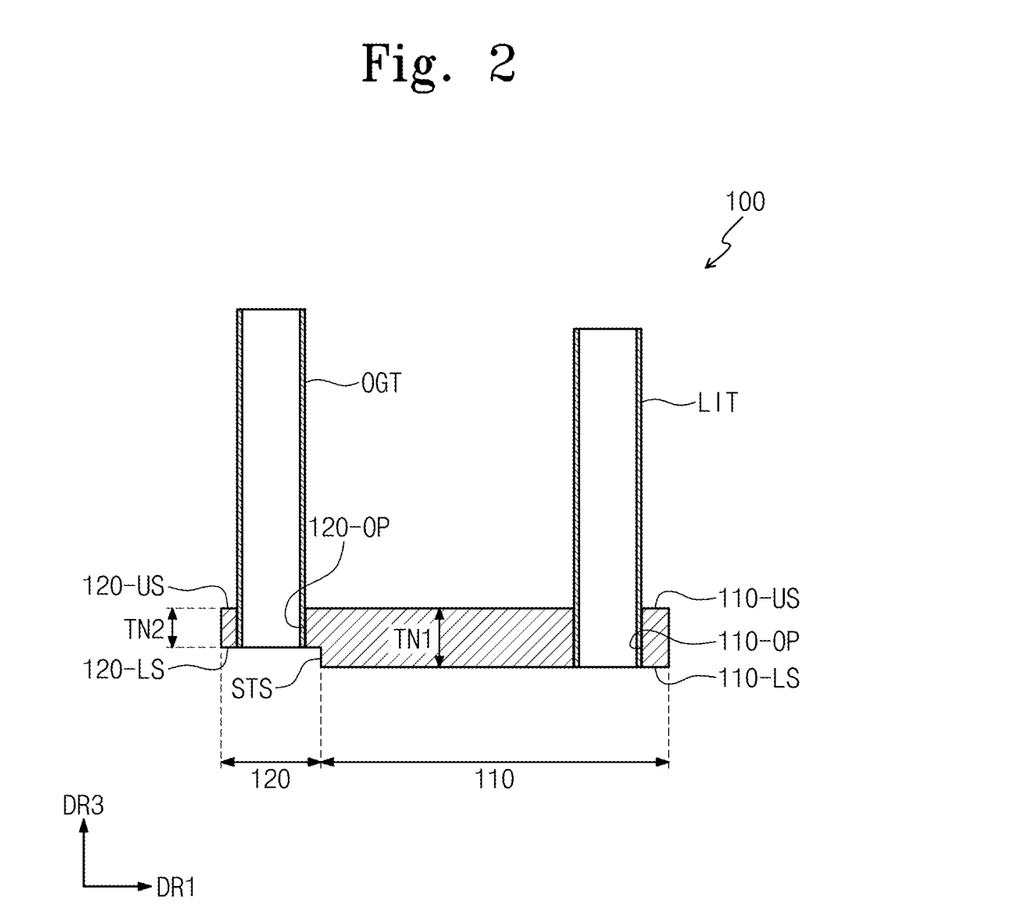
FIG. 2 is a side sectional view of the mask shown in FIG. 1.

FIG. 1 is an exploded perspective view of a mask according to example embodiments of the inventive concept, and FIG. 2 is a side sectional view of the mask shown in FIG. 1. A mask for forming a semiconductor pattern (hereinafter, referred to as a 'mask') according to example embodiments of the inventive concept will be described with reference to FIGS. 1 and 2.

As shown in FIGS. 1 and 2, a mask 100 may include a first body portion 110 and a second body portion 120. Depending upon the method used to form the mask 100, the first body portion 110 and the second body portion 120 may have a single-body structure or a combined two-body structure. The mask 100 may be formed of, for example, plastic, glass, or metal.

The first body portion 110 may include a first upper surface 110-US, a first lower surface 110-LS, and a first through hole 110-OP. The first through hole 110-OP may be formed so as to penetrate the first body portion 110 in a direction that is parallel to a thickness direction DR3 of the first body portion 110. For example, the first upper surface 110-US may be connected to the first lower surface 110-LS through the first through hole 110-OP. The first body portion 110 may further include connecting surfaces connecting the first upper surface 110-US to the first lower surface 110-LS.

The first through hole 110-OP may be configured to allow a liquid semiconductor material to be injected from above the first upper surface 110-US to below the first lower surface 110-LS. In example embodiments, the first lower surface 110-LS may be flat, and this makes it possible to improve uniformity of the thickness of a semiconductor pattern made with the mask 110. But example embodiments of the inventive concept are not limited thereto. For example, in other example embodiments, the first upper surface 110-US may be flat or curved.

The second body portion 120 may include a second upper surface 120-US, a second lower surface 120-LS, and a second through hole 120-OP. The second through hole 120-OP may be formed so as to penetrate the second body portion 120 in a direction that is parallel to the thickness direction DR3. Accordingly, the second upper surface 120-US may be connected to the second lower surface 120-LS through the second through hole 120-OP. The second body portion 120 may further include connecting surfaces connecting the second upper surface 120-US to the second lower surface 120-LS.

The second lower surface 120-LS may be so that along direction DR3, it has a level that is closer to the first upper surface 110-US, as compared to the first lower surface 110-LS. That is, the position of the second lower surface 120-LS along direction DR3 is closer to the position of the first upper surface along direction DR3 than the position of the first lower surface 110-LS is along direction DR3. In the example embodiment shown in FIG. 2 in which the first upper surface 110-US and second upper surface 120-US are along the same plane, when measured along the third direction DR3, a thickness TN1 of the first body portion 110 may be greater than a thickness TN2 of the second body portion 120. Thus, the first and second lower surfaces 110-LS and 120-LS may form a staircase structure. The second lower surface 120-LS and the first lower surface 110-LS may be connected to each other by a stepped surface STS.

The second through hole 120-OP may be configured in such a way that gas can be exhausted from below the second lower surface 120-LS to above the second upper surface 120-US. The type of the gas that is used may be changed depending upon the process condition for forming the semiconductor pattern. In example embodiments, the gas may be nitrogen or air.

A portion of a supplying conduit LIT may be inserted into the first through hole 110-OP. The supplying conduit LIT may provide the liquid semiconductor material to the first through hole 110-OP.

A portion of an exhausting conduit OGT may be inserted into the second through hole 120-OP. A gas that flows into and through the second through hole 120-OP may be exhausted to the exterior of the mask through the exhausting conduit OGT.

The first upper surface 110-US and the second upper surface 120-US may coplanar with each other. The first through hole 110-OP and the second through hole 120-OP may be disposed so that they are spaced apart from each other in a first direction DR1, on a plane including the first upper surface 110-US and the second upper surface 120-US.

The second through hole 120-OP may be formed to have a structure that is elongated along a second direction DR2 crossing the first direction DR1, when viewed on the plane.

When measured along the second direction DR2, a length of the second through hole 120-OP may be approximately equivalent to a length of the mask. As will be described below, by virtue of the elongated structure of the second through hole 120-OP in the second direction DR2, it is possible to crystallize the semiconductor material both uniformly and quickly.

When measured along the third direction DR3, a thickness TN1 of the first body portion 110 may be greater than a thickness TN2 of the second body portion 120. When measured along the second direction DR2, a length of the first body portion 110 may be substantially equivalent to that of the second body portion 120.

Figure 3A:
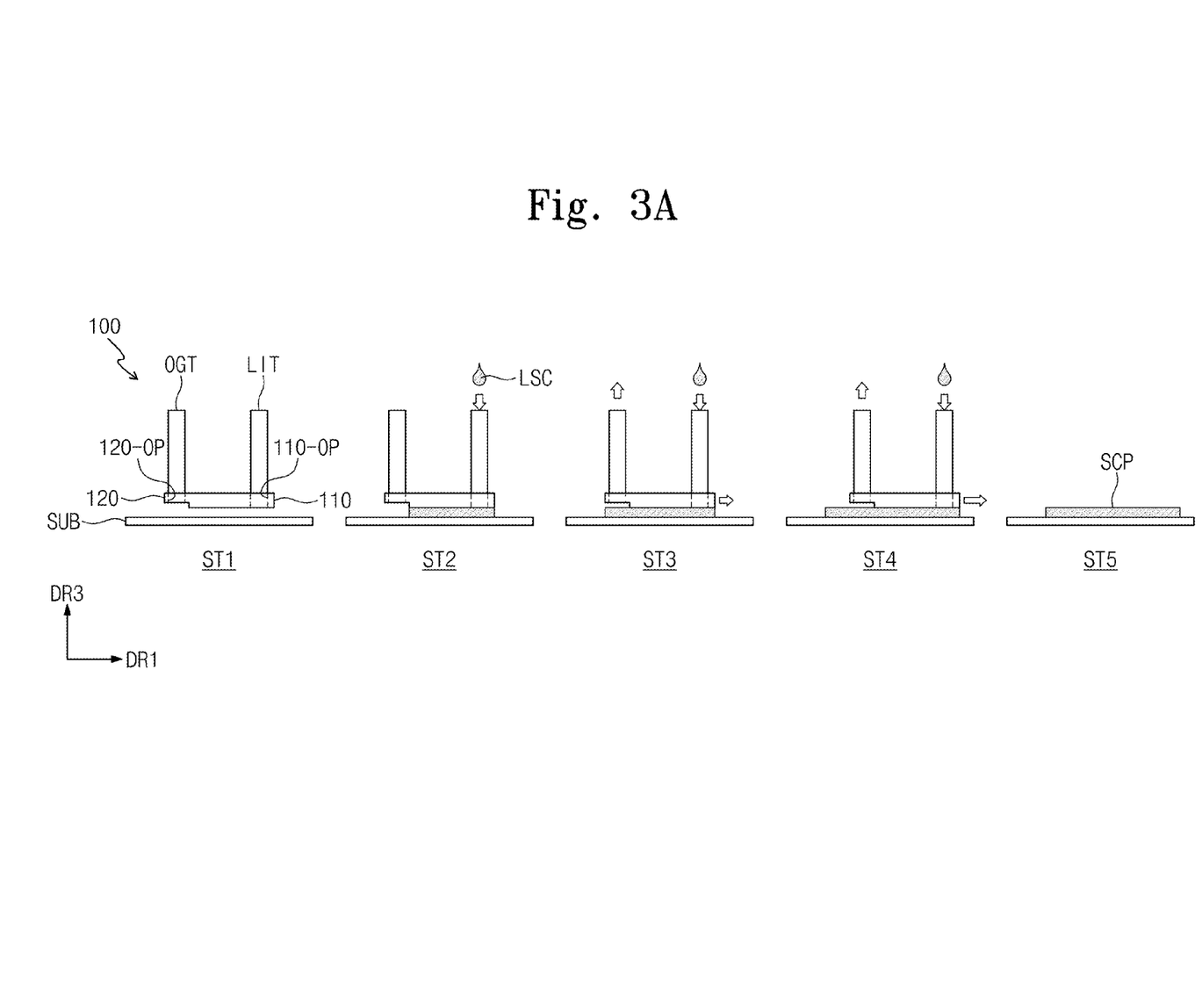
FIGS. 3A and 3B are diagrams schematically illustrating a process of forming a semiconductor pattern using the mask shown in FIG. 1.
Figure 3B:
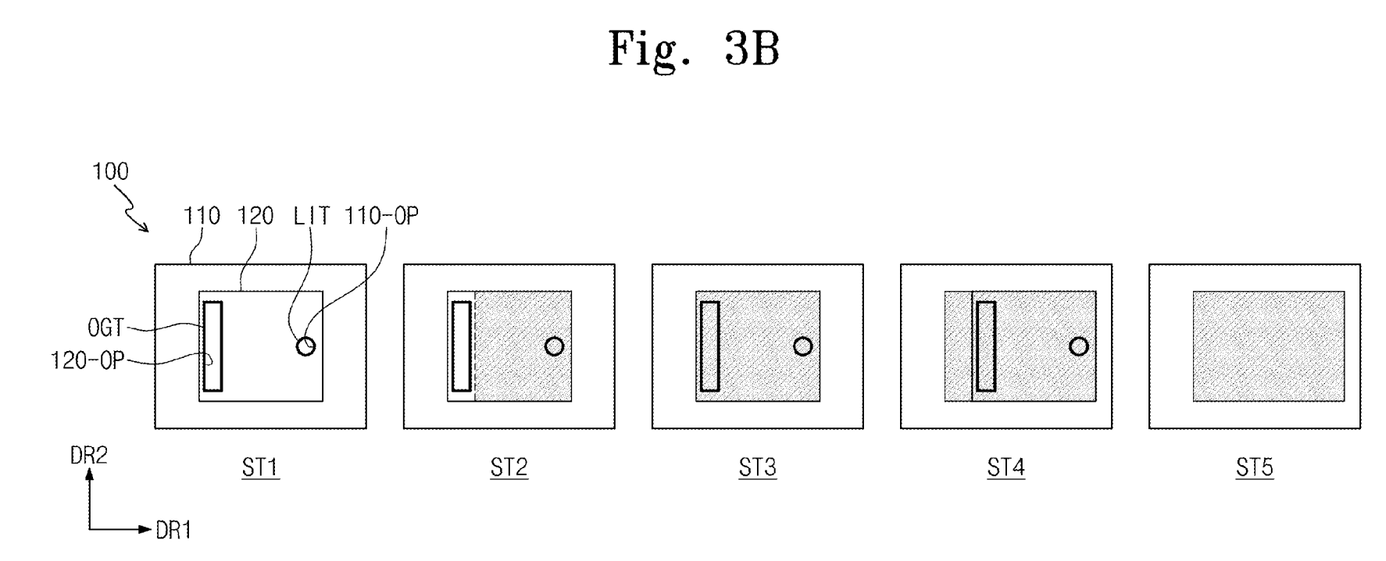

FIGS. 3A and 3B are side and plan views, respectively, schematically illustrating a process of forming a semiconductor pattern using the mask shown in FIG. 1.

The mask 100 may be disposed on a base substrate SUB (in ST1). The base substrate SUB may constitute a portion of a display panel or a semiconductor device. The base substrate SUB may be, for example, a glass substrate or a silicon substrate. The display panel may be, for example, a liquid crystal display panel, an electrophoresis display panel, or an organic light-emitting display panel. The semiconductor device may be, for example, a thin-film transistor or a diode.

A position of the mask 100 may be adjusted in such a way that the first lower surface 110-LS (of FIG. 2) is provided parallel to the base substrate SUB. The base substrate SUB and the first lower surface 110-LS may be disposed so that they are spaced apart from each other by a predetermined distance. The distance between the base substrate SUB and the first lower surface 110-LS may be uniform in the entire area of the first lower surface 110-LS. In other words, the mask 100 may be disposed at a reference position for forming the semiconductor pattern. In example embodiments, the distance between the base substrate SUB and the first lower surface 110-LS may be adjusted to control a thickness of the semiconductor pattern to be described below.

Next, a liquid semiconductor material LSC may be supplied onto the base substrate SUB through the first through hole 110-OP (in ST2). The liquid semiconductor material LSC may be injected into the supplying conduit LIT. The liquid semiconductor material LSC may be stored in the supplying conduit LIT, and the liquid semiconductor material may be supplied to the first through hole 110-OP.

The liquid semiconductor material LSC may contain a solvent and a semiconductor material dissolved or distributed by the solvent. The semiconductor material may include an organic material (e.g., containing silicon, gallium, or germanium) or metal oxides (e.g., Indium Tin Oxide (ITO) or Zinc Oxide (ZnO)).

The liquid semiconductor material LSC may spread from the first through hole 110-OP over the substrate SUB to be overlapped with the first lower surface 110-LS, in a plan view. While not wishing to be bound to any particular theory, the spreading may occur as the result of a surface tension exerted by the base substrate SUB and the first lower surface 110-LS, or by a capillary phenomenon. Because a separation distance between the second lower surface 120-LS and the base substrate SUB is greater than that between the first lower surface 110-LS and the base substrate SUB, the liquid semiconductor material LSC may not be spread to a region overlapped with the second lower surface 120-LS.

Thereafter, the mask 100 may be moved (in ST3). The movement of the mask 100 may make it possible to increase an area of the liquid semiconductor material LSC supplied on the base substrate SUB.

An gas suction process may be performed through the second through hole 120-OP (in ST4). The gas suction process may be performed to remove gas through the exhausting conduit OGT. The gas suction process may be started after the movement of the mask 100. But example embodiments of the inventive concept may not be limited thereto, and the gas suction process may be started when the mask 100 is moved or the liquid semiconductor material LSC is supplied on the base substrate SUB.

As the result of the gas suction process, the solvent may be evaporated from the liquid semiconductor material LSC coated on the base substrate SUB. As the solvent is evaporated, the semiconductor material may be crystallized to form a semiconductor pattern SCP. A grain size of the semiconductor pattern SCP may be controlled by adjusting an amount of the gas exhausted, i.e., the flow rate through the second through hole 120-OP.

After the formation of the semiconductor pattern SCP, the mask 100 may be moved from the reference position to a stand-by position (in ST5). At the stand-by position, the mask 100 may be maintained to form a semiconductor pattern on another base substrate. In example embodiments, the semiconductor pattern SCP may be formed to have substantially the same length as the length of the mask 100, when measured along the second direction DR2.

Figure 4:
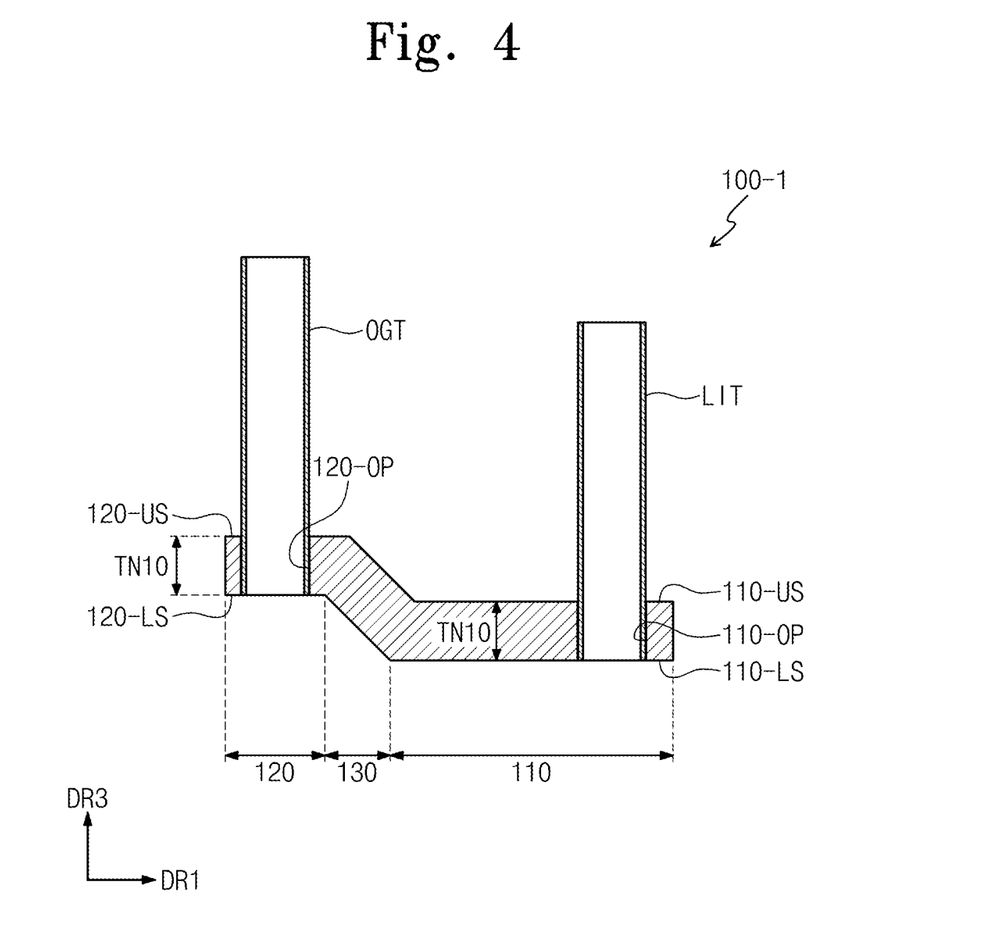
FIG. 4 is a side sectional view illustrating a mask according to example embodiments of the inventive concept.
Figure 5:
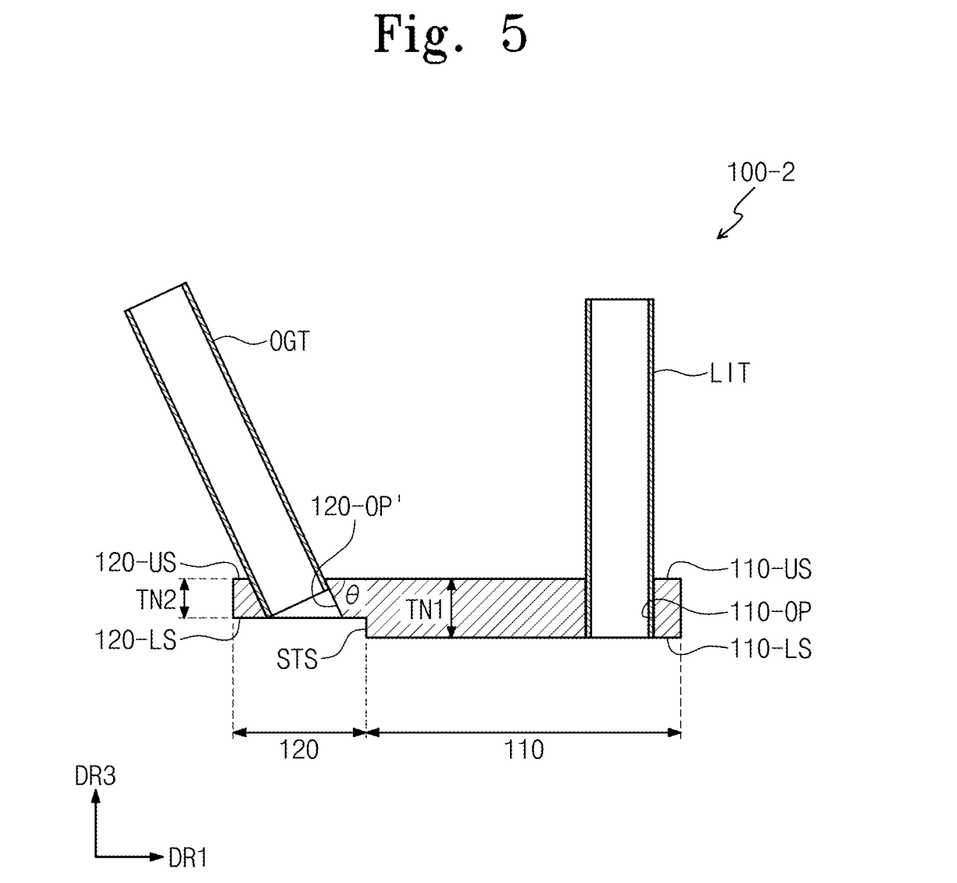
FIG. 5 is a side sectional view illustrating a mask according to other example embodiments of the inventive concept.

FIG. 4 is a side sectional view illustrating a mask according to example embodiments of the inventive concept, and FIG. 5 is a side sectional view illustrating a portion of a mask according to other example embodiments of the inventive concept. The mask according to example embodiments of the inventive concept will be described with reference to FIGS. 4 and 5. However, for concise description, overlapping description of elements previously described with reference to FIGS. 1, 2, 3A, and 3B may be omitted.

As shown in FIG. 4, a mask 100-1 may further include a bending portion 130 connecting the first body portion 110 to the second body portion 120 along the first direction DR1. The first body portion 110, the second body portion 120, and the bending portion 130 may be configured to form a single body structure.

The second body portion 120 may have substantially the same thickness TN10 as that of the first body portion 110. This makes it possible to suppress a crack from forming in the second body portion 120 (for example, near the second through hole 120-OP). Because of the bend portion 130, the position of the second lower surface 120-LS along direction DR3 is closer to the position of the first upper surface along direction DR3 than the position of the first lower surface 110-LS is along direction DR3, even though the thickness TN10 of the second body portion 120 and first body portion 110 may be substantially the same.

As shown in FIG. 5, a second through hole 120-OP' may be formed to penetrate the second body portion 120 at an angle that is not perpendicular to the second lower surface 120-LS. For example, an inner wall of the second through hole 120-OP' may form an angle 0 with respect to the second lower surface 120-LS or the second upper surface 120-US.

Because the second through hole 120-OP' penetrates the second body portion 120 at an angle, the crystal direction of semiconductor pattern SCP (e.g., of FIG. 3B) may be altered as compared to a mask 100 illustrated in FIG. 2. In the case where a mask 100-2 of FIG. 5 is used, the semiconductor pattern SCP (e.g., of FIGS. 3A and 3B) may have a crystal direction that is at an angle to the base substrate SUB.

Figure 6:
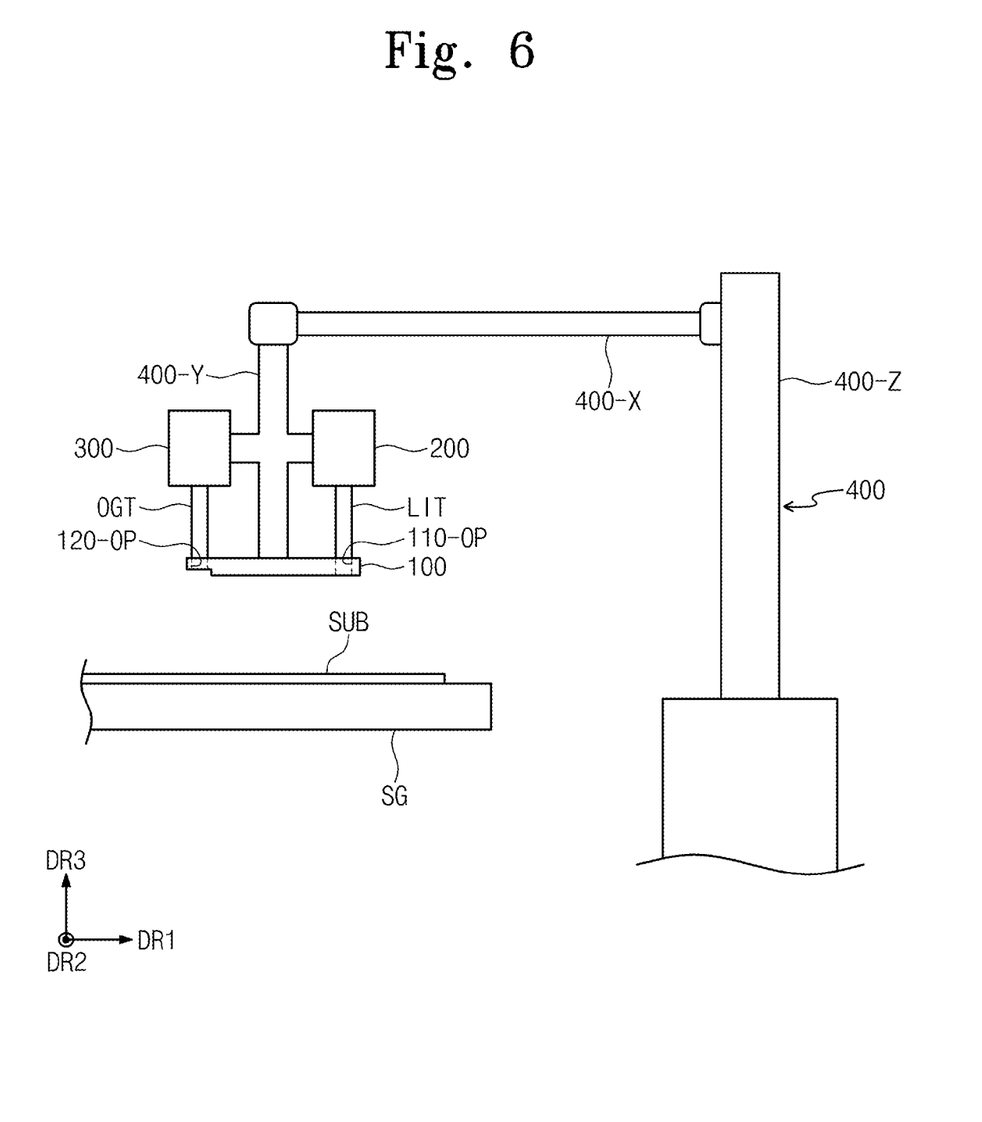
FIG. 6 is a side view schematically illustrating a system for forming a semiconductor pattern, according to example embodiments of the inventive concept.

FIG. 6 is a side view schematically illustrating a system for forming a semiconductor pattern, according to example embodiments of the inventive concept. Hereinafter, a system for forming a semiconductor pattern will be described with reference to FIG. 6.

The system may include one of the masks 100, 100-1, and 100-2 described with reference to FIGS. 1 through 5, a supplying part 200 supplying the liquid semiconductor material, gas suction part 300 removing the gas, a driving part 400 controlling a position of the mask 100. The mask shown in FIGS. 1 and 2 is exemplarily illustrated in FIG. 6.

The supplying part 200 may be configured to supply a liquid semiconductor material to the first through hole 110-OP of the mask 100. The supplying part 200 may include a storage tank, a syringe pump, and so forth. The supplying part 200 may supply the liquid semiconductor material through the supplying conduit LIT, whose portion is inserted into the first through hole 110-OP.

The gas suction part 300 may be configured to suction the gas from the second through hole 120-OP of the mask 100. The gas suction part 300 may include a vacuum pump and so forth. The gas suction part 300 may suck the gas through the exhausting conduit OGT, whose portion is inserted into the second through hole 120-OP.

The driving part 400 may include an X-axis 400-X for moving the mask 100 along the first direction DR1, a Y-axis 400-Y for moving the mask 100 along the second direction DR2, and a Z-axis 400-Z for moving the mask 100 along the third direction DR3. In other embodiments, the driving part 400 may be provided in the form of a robot arm.

The Z-axis 400-Z may dispose the mask 100 on the base substrate SUB provided on a stage SG. The X-axis 400-X may move the mask 100 along the first direction DR1, when the liquid semiconductor material is supplied on the base substrate SUB. The Y-axis 400-Y may move the mask 100 along the second direction DR2, before forming the semiconductor pattern SCP (e.g., of FIGS. 3A and 3B) on other region of the base substrate SUB.

Figure 7:
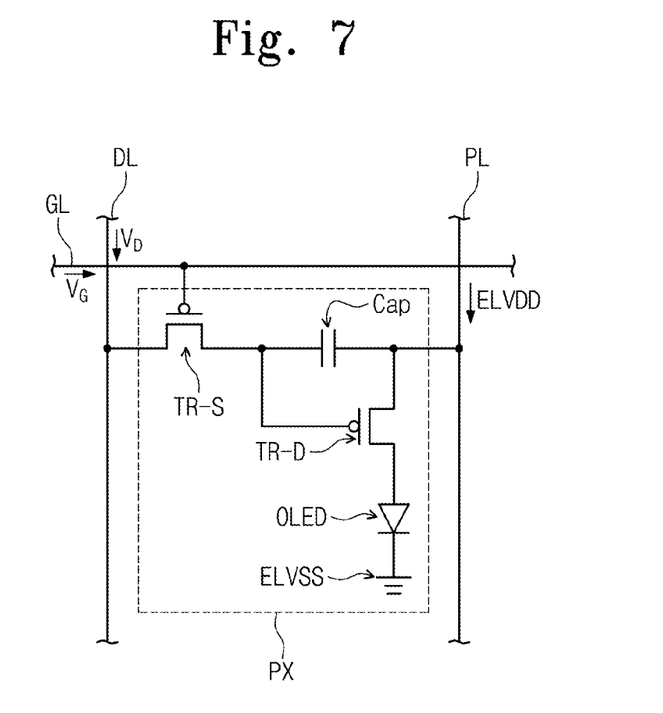
FIG. 7 is a circuit diagram of a pixel according to example embodiments of the inventive concept.
Figure 8:
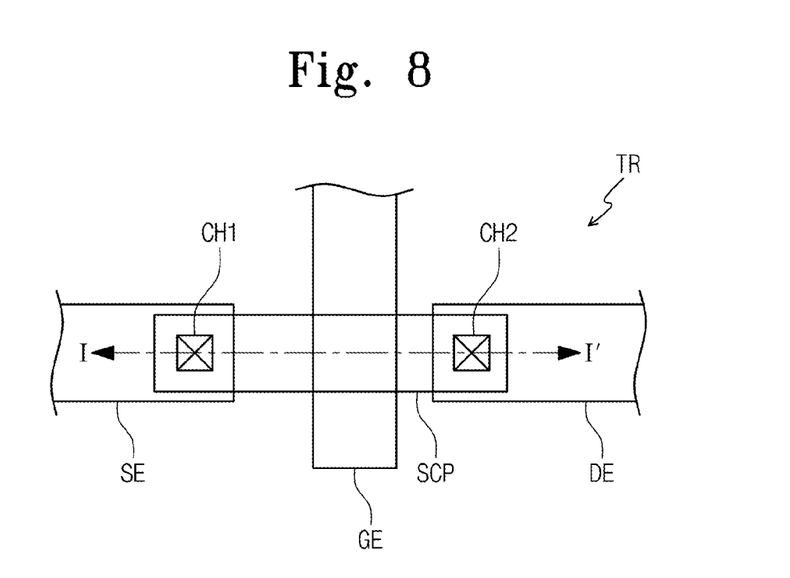
FIG. 8 is a top view of a thin-film transistor according to example embodiments of the inventive concept.
Figure 9:
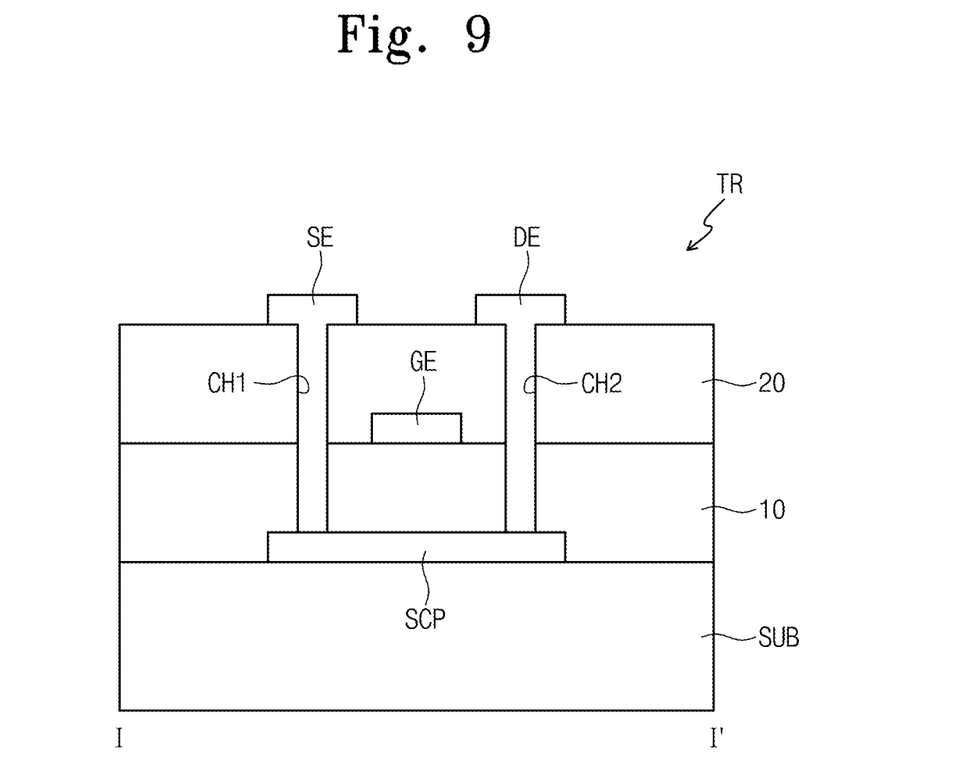
FIG. 9 is a sectional view of the thin-film transistor of FIG. 8.
Figure 10:
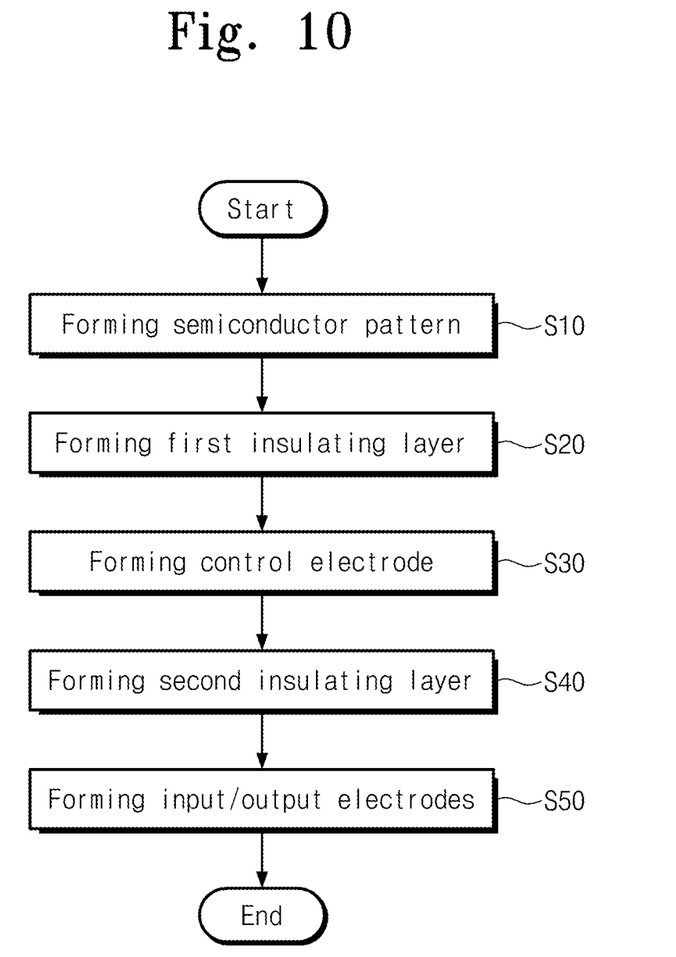
FIG. 10 is a flow chart illustrating a process of fabricating the thin-film transistor of FIG. 8.

FIG. 7 is a circuit diagram of a pixel according to example embodiments of the inventive concept. FIG. 8 is a top view of a thin-film transistor according to example embodiments of the inventive concept, and FIG. 9 is a sectional view of the thin-film transistor of FIG. 8. FIG. 10 is a flow chart illustrating a process of fabricating the thin-film transistor of FIG. 8. Hereinafter, a method of fabricating a semiconductor device, according to example embodiments of the inventive concept, will be described with reference to FIGS. 7 through 10. In order to reduce complexity in the drawings and to provide better understanding of example embodiments of the inventive concept, a thin-film transistor, which is a portion of the semiconductor device, is exemplarily illustrated in FIGS. 8 and 9.

FIG. 7 is an equivalent circuit diagram exemplarily illustrating a pixel PX of an organic light-emitting display panel, but example embodiments of the inventive concept may not be limited thereto. For example, the pixel PX may be variously modified from that of FIG. 7.

The pixel PX may include a switching thin-film transistor TR-S, a driving thin-film transistor TR-D, a capacitor Cap, and an organic light-emitting device OLED. The switching thin-film transistor TR-S may output data voltage $D_V$ applied to a data line DL, in response to a gate voltage $V_G$ applied to a gate line GL. The driving thin-film transistor TR-D may supply an operation current to the organic light-emitting device OLED, in response to a voltage applied through the switching thin-film transistor TR-S.

At least one of the switching thin-film transistor TR-S and the driving thin-film transistor TR-D may be the thin-film transistor TR shown in FIGS. 8 and 9. The thin-film transistor TR may include a control electrode GE, an input electrode SE, the semiconductor pattern SCP, and an output electrode DE. The thin-film transistor TR shown in FIGS. 8 and 9 is an example in which the thin-film transistor is configured to have a top-gate structure.

A method of fabricating the thin-film transistor TR will be described in more detail with reference to FIGS. 8 through 10. The semiconductor pattern SCP may be formed on the base substrate SUB using the mask 100 (in S10). The formation of the semiconductor pattern SCP may be performed using the same process as that described with reference to FIGS. 3A and 3B.

The first insulating layer 10 may be formed on the base substrate SUB to cover the semiconductor pattern SCP (in S20). The first insulating layer 10 may include an organic material or an inorganic material. Further, the first insulating layer 10 may be formed to have a multi-layered structure. For example, the first insulating layer 10 may include at least one of an organic layer or an inorganic layer, a plurality of organic layers, or a plurality of inorganic layers.

The first insulating layer 10 may be formed using a spin coating process, an ink jet printing process, a nozzle printing process, or a plasma deposition process. In certain embodiments, the first insulating layer 10 may be formed after performing an ion implantation process to the crystallized semiconductor pattern SCP.

The control electrode GE may be formed on the first insulating layer 10 in such a way that it is overlapped with a portion of the semiconductor pattern SCP (in S30). The formation of the control electrode GE may include forming a conductive layer and patterning the conductive layer using a photolithography process. The control electrode GE may be performed using the process for forming another interconnection line, such as the gate line GL.

A second insulating layer 20 may be formed on the first insulating layer 10 to cover the control electrode GE (in S40). The second insulating layer 20 may be formed by, for example, one of the methods for forming the first insulating layer 10, and in this case, the second insulating layer 20 may have substantially the same structure as the first insulating layer 10.

The input electrode SE and the output electrode DE may be formed on the second insulating layer 20 (in S50). The input electrode SE and the output electrode DE may be disposed spaced apart from each other. The input electrode SE may be connected to a portion of the semiconductor pattern SCP, and the output electrode DE may be connected to other portion of the semiconductor pattern SCP.

A first contact hole CH1 and a second contact hole CH2 may be formed before the formation of the input and output electrodes SE and DE. The first contact hole CH1 and the second contact hole CH2 may be formed, for example, by irradiating a laser beam onto a stack of the first and second insulating layers 10 and 20.

The input electrode SE and the output electrode DE may be formed by forming a conductive layer on the second insulating layer 20 to fill the first contact hole CH1 and the second contact hole CH2 and patterning the conductive layer using a photolithography process.

Even in the case where the thin-film transistor has the top-gate structure, its fabrication method may be modified depending on a layer structure. For example, the semiconductor pattern SCP may be formed on the base substrate SUB, the input electrode SE and the output electrode DE may be formed to be overlapped with different regions, respectively, of the semiconductor pattern SCP, and then, the first insulating layer 10 may be formed thereon. Thereafter, the control electrode GE may be formed, and then, the second insulating layer 20 may be formed.

Figure 11:
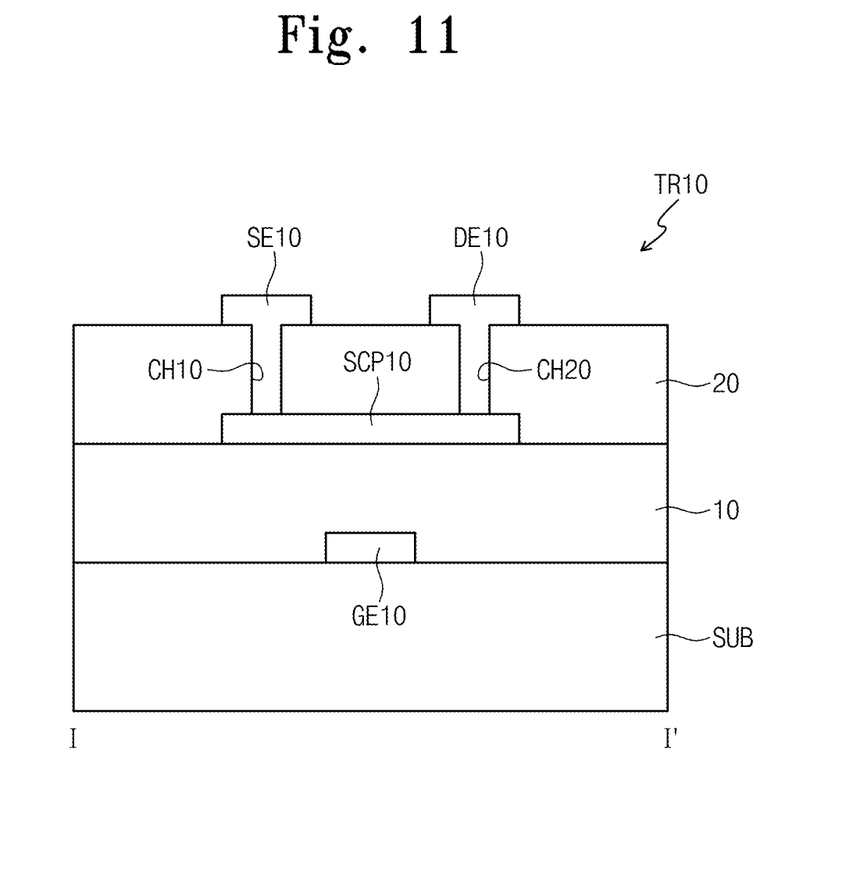
FIG. 11 is a sectional view of a thin-film transistor according to other example embodiments of the inventive concept.
Figure 12:
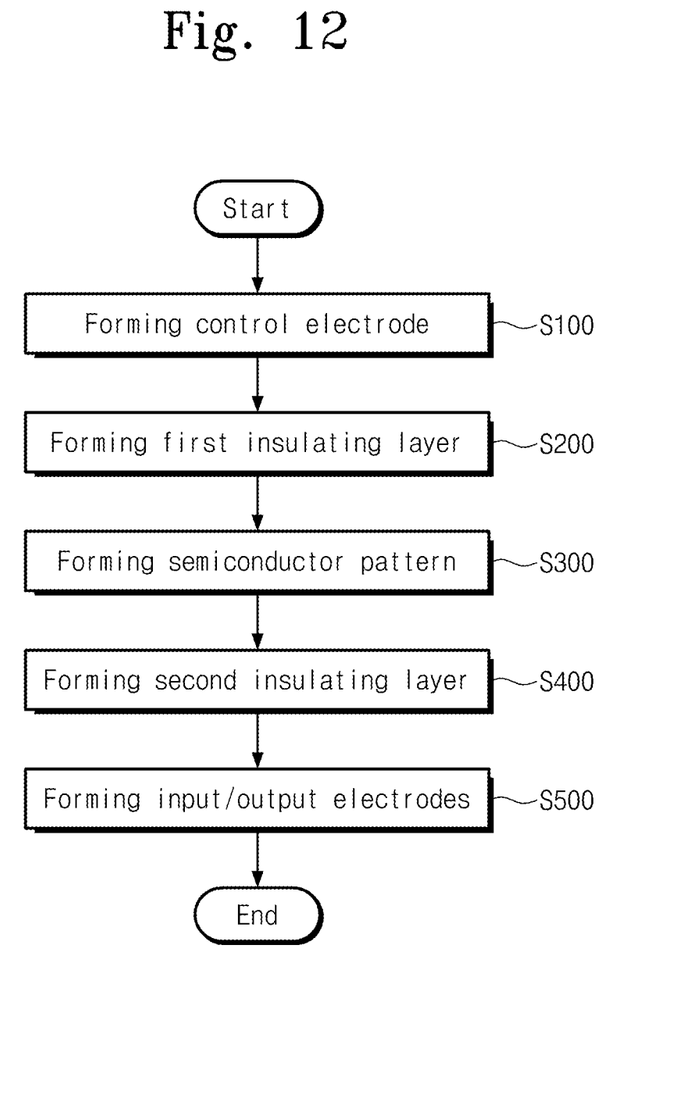
FIG. 12 is a flow chart illustrating a process of fabricating the thin-film transistor of FIG. 11.

FIG. 11 is a sectional view of a thin-film transistor according to other example embodiments of the inventive concept. FIG. 12 is a flow chart illustrating a process of fabricating the thin-film transistor of FIG. 11. Hereinafter, a method of fabricating a semiconductor device, according to example embodiments of the inventive concept will be described with reference to FIGS. 11 and 12. However, for concise description, overlapping description of steps previously described with reference to FIGS. 7 through 10 may be omitted.

As shown in FIG. 11, a thin-film transistor TR10 may include a control electrode GE10, an input electrode SE10, a semiconductor pattern SCP10, and an output electrode DE10. The thin-film transistor TR10 shown in FIG. 11 is an example in which the thin-film transistor TR10 is configured to have a bottom-gate structure.

The control electrode GE10 may be formed on the base substrate SUB (in S100). The control electrode GE10 may be formed by forming a conductive layer and patterning the conductive layer using a photolithography process.

The first insulating layer 10 may be formed on the base substrate SUB to cover the control electrode GE10 (in S200). The first insulating layer 10 may be formed using a spin coating process, an ink jet printing process, a nozzle printing process, or a plasma deposition process.

The semiconductor pattern SCP may be formed on the first insulating layer 10 (in S300). The second insulating layer 20 may be formed on the first insulating layer 10 to cover the semiconductor pattern SCP (in S400).

The input electrode SE and the output electrode DE may be formed on the second insulating layer 20 (in S500). A first contact hole CH10 and a second contact hole CH20 may be formed by irradiating a laser beam to the second insulating layer 20, and then, a plating process and a photolithography process may be performed to form the input electrode SE10 and the output electrode DE10.

Even in the case where the thin-film transistor has the bottom-gate structure, its fabrication method may be modified depending on a layer structure. For example, the semiconductor pattern SCP may be formed on the first insulating layer 10, the input electrode SE10 and the output electrode DE10 may be formed to be overlapped with different regions, respectively, of the semiconductor pattern SCP, and then, the second insulating layer 20 may be formed on the input electrode SE10 and the output electrode DE10 to protect them.

According to example embodiments of the inventive concept, a thickness of the semiconductor pattern can be controlled by adjusting a space between the base substrate and the first lower surface of the first body portion. Accordingly, if the space between the base substrate and the first lower surface of the first body portion is controlled to be uniform, it is possible to form the semiconductor pattern having a uniform thickness.

The liquid semiconductor material may be supplied onto the base substrate through the first through hole and, at the same time, be crystallized by the gas suction process that is performed through the second through hole. This makes it possible to reduce time needed for forming the semiconductor pattern. Further, a grain size of the semiconductor pattern can be controlled by adjusting an amount of the gas exhausted through the second through hole. If the second through hole is formed at an angle to the second body portion, it is possible to control a crystal direction of the semiconductor pattern.

A width of the semiconductor pattern in the second direction is dependent on that of the body portion in the second direction, and a width of the semiconductor pattern in the first direction is dependent on a moving distance of the mask. Accordingly, it is possible to adjust an area of the semiconductor pattern with ease.

While example embodiments of the inventive concepts have been particularly shown and described, it will be understood by one of ordinary skill in the art that variations in form and detail may be made therein without departing from the spirit and scope of the disclosure, including the attached claims.

What is claimed is:

1. A mask for forming a semiconductor pattern, comprising:
a first body portion including a first lower surface, a first upper surface, and a first through hole configured to allow a liquid semiconductor material to flow from the first upper surface toward the first lower surface; and
a second body portion including a second lower surface, a second upper surface, and a second through hole configured to allow a gas to be exhausted from below the second lower surface to above the second upper surface, the second lower surface being positioned closer to the first upper surface as compared with the first lower surface, thereby forming a staircase structure.

2. The mask of claim 1, further comprising a supplying conduit supplying the liquid semiconductor material to the first through hole, the supplying conduit including a portion inserted into the first through hole.

3. The mask of claim 1, wherein the first body portion and the second body portion are provided to form a single body.

4. The mask of claim 1, further comprising an exhausting conduit guiding the gas to be exhausted through the second through hole, the exhausting conduit including a portion inserted into the second through hole.

5. The mask of claim 4, wherein the second through hole penetrates the second body portion at an angle that is not perpendicular to the second lower surface.

6. The mask of claim 5, further comprising a bending portion connecting the first body portion to the second body portion along the first direction.

7. The mask of claim 1, wherein, in a plan view, the first through hole and the second through hole are disposed spaced apart from each other along a first direction and the second through hole has a shape extending along a second direction crossing the first direction.

8. The mask of claim 7, wherein the first body portion has a thickness greater than that of the second body portion, when measured along a direction normal to a plane defined by the first and second directions.

9. The mask of claim 8, wherein the first body portion and the second body portion have the same width, when measured along the second direction.

10. A system for forming a semiconductor pattern, comprising:
a mask including a first body portion and a second body portion, the first body portion including a first lower surface, a first upper surface, and a first through hole configured to allow a liquid semiconductor material to be injected from above the first upper surface toward the first lower surface, the second body portion including a second lower surface, a second upper surface, and a second through hole configured to allow a gas to be exhausted from below the second lower surface to above the second upper surface, the second lower surface being positioned closer to the first upper surface as compared with the first lower surface, thereby forming a staircase structure;
a supplying part supplying the liquid semiconductor material to the first through hole;
a gas suction part sucking the gas through the second through hole; and
a driving part controlling a position of the mask.

11. The system of claim 10, further comprising:
a supplying conduit connecting the first through hole to the supplying part; and
an exhausting conduit connecting the second through hole to the gas suction part.

12. A method of fabricating a semiconductor device, comprising:
forming a semiconductor pattern on a surface of a base substrate using a mask, the mask including a first body portion and a second body portion, the first body portion including a first lower surface, a first upper surface, and a first through hole allowing a liquid semiconductor material to be injected from above the first upper surface toward the first lower surface, the second body portion including a second lower surface, a second upper surface, and a second through hole allowing a gas to be exhausted from below the second lower surface to above the second upper surface, the second lower surface being positioned closer to the first upper surface as compared with the first lower surface, thereby forming a staircase structure;
forming a control electrode to be partially overlapped with the semiconductor pattern;
forming an input electrode to be connected to a portion of the semiconductor pattern; and
forming an output electrode to be connected to an other portion of the semiconductor pattern and be disposed spaced apart from the input electrode.

13. The method of claim 12, wherein the forming of the semiconductor pattern comprises:
positioning the mask at a reference position, thereby disposing the first lower surface of the first body portion to face and be spaced apart from the base substrate;
supplying the liquid semiconductor material to the base substrate through the first through hole;
moving the mask to increase an area of the liquid semiconductor material supplied on the base substrate; and
sucking the gas through the second through hole.

14. The method of claim 12, further comprising:
forming a first insulating layer on the base substrate to cover the semiconductor pattern; and
forming a second insulating layer on the first insulating layer to cover the control electrode.

15. The method of claim 14, further comprising:
forming a first contact hole to penetrate the first and second insulating layers, thereby allowing the input electrode to be connected to the portion of the semiconductor pattern; and
forming a second contact hole to penetrate the first and second insulating layers, thereby allowing the output electrode to be connected to the other portion of the semiconductor pattern.

16. The method of claim 12, further comprising forming a first insulating layer on the base substrate to cover the control electrode, between the forming of the control electrode and the forming of the semiconductor pattern.

17. The method of claim 16, further comprising forming a second insulating layer on the first insulating layer to cover the input and output electrodes, after the forming of the input electrode and the forming of the output electrode.

* * * * *